US 8,035,072 B2

(12) United States Patent
Fukuda et al.

(10) Patent No.: US 8,035,072 B2
(45) Date of Patent: Oct. 11, 2011

(54) OPTICAL SEMICONDUCTOR DEVICE AND INFRARED DATA COMMUNICATION APPARATUS ELIMINATING LOW FREQUENCY COMPONENT

(75) Inventors: Hideo Fukuda, Kyoto (JP); Hiroshi Yamaguchi, Osaka (JP)

(73) Assignee: Panasonic Corporation, Osaka (JP)

( * ) Notice: Subject to any disclaimer, the term of this patent is extended or adjusted under 35 U.S.C. 154(b) by 417 days.

(21) Appl. No.: 12/204,834

(22) Filed: Sep. 5, 2008

(65) Prior Publication Data

US 2009/0090847 A1 Apr. 9, 2009

(30) Foreign Application Priority Data

Oct. 9, 2007 (JP) ................... 2007-263580

(51) Int. Cl.
*H03F 3/08* (2006.01)
(52) U.S. Cl. .............. 250/214 A; 250/214.1; 330/308
(58) Field of Classification Search ........... 250/214 AG, 250/214 R, 214.1, 201.5, 214 A; 330/308
See application file for complete search history.

(56) References Cited

U.S. PATENT DOCUMENTS

| | | | |
|---|---|---|---|
| 5,514,989 A | 5/1996 | Sato et al. | |
| 5,693,934 A * | 12/1997 | Hohmoto et al. | 250/214 A |
| 7,245,188 B2 | 7/2007 | Fukuda et al. | |
| 7,335,872 B2 | 2/2008 | Fukuda et al. | |
| 7,812,299 B2 * | 10/2010 | Kusaka | 250/208.1 |
| 2003/0090326 A1 | 5/2003 | Pogrebinsky et al. | |
| 2006/0044070 A1 | 3/2006 | Fujita | |
| 2007/0018079 A1 | 1/2007 | Chato et al. | |
| 2007/0075223 A1 | 4/2007 | Murao et al. | |
| 2007/0108374 A1 | 5/2007 | Fukuda et al. | |
| 2007/0228258 A1 | 10/2007 | Yamaguchi et al. | |
| 2008/0054162 A1 | 3/2008 | Fukuda et al. | |

FOREIGN PATENT DOCUMENTS

| | | | |
|---|---|---|---|
| JP | 4-032307 | | 2/1992 |
| JP | 5-235404 | | 9/1993 |
| JP | 6-196746 | | 7/1994 |
| WO | WO2007/011026 | * | 1/2007 |

OTHER PUBLICATIONS

English language Abstract JP 4-032307 A.
Japanese Office Action for the corresponding Japanese Patent Application No. 2007-263580, mailed May 24, 2011.

* cited by examiner

*Primary Examiner* — Francis M LeGasse, Jr.
(74) *Attorney, Agent, or Firm* — Greenblum & Bernstein, P.L.C.

(57) ABSTRACT

An optical semiconductor device and an infrared data communication apparatus eliminating a direct current component and a low frequency component included in a light signal. The optical semiconductor device converts a light signal into an electric signal and amplifies the converted electric signal. The optical semiconductor device includes: a photodiode which converts a light signal into a current signal; another photodiode which converts a light signal into a current signal; a current amplifying circuit which includes an operational amplifier which amplifies an output current from the photodiode; and a current-voltage conversion circuit which converts an output current from the other photodiode into a voltage. An output terminal of the current amplifying circuit is connected to an input terminal of the current-voltage conversion circuit.

18 Claims, 8 Drawing Sheets

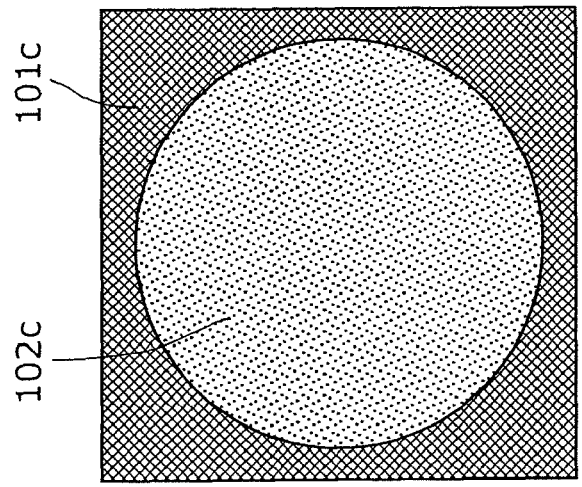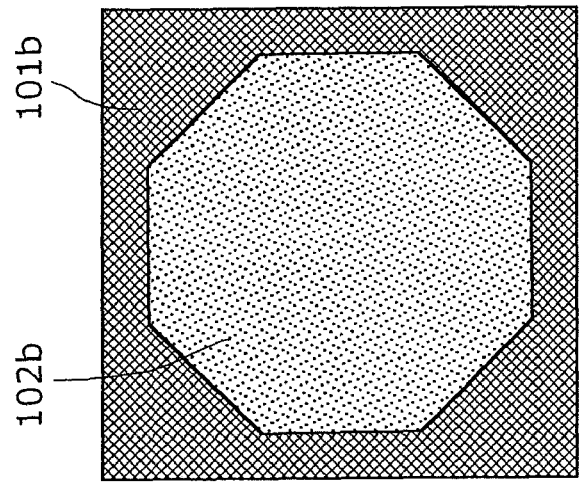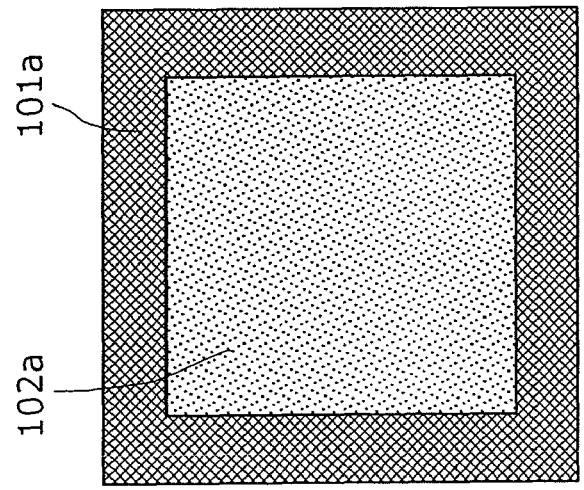

OPTICAL SEMICONDUCTOR DEVICE AND INFRARED DATA COMMUNICATION APPARATUS ELIMINATING LOW FREQUENCY COMPONENT

BACKGROUND OF THE INVENTION (1) Field of the Invention

The present invention relates to an optical semiconductor device and an infrared data communication apparatus eliminating a direct current component and a low frequency component included in a light signal, and amplifying a high frequency component only.

(2) Description of the Related Art

Infrared data communication apparatuses for communicating data, using an infrared light signal between: mobile communications devices; or a personal computer and a peripheral device conform to the IrDA (Infrared Data Association) standard. FIG. 1 exemplifies an optical semiconductor device in the infrared data communication apparatuses.

For example, the optical semiconductor device in the drawing receives, with a photodiode 401 a light signal, and photoelectrically converts the received light signal. Here, the light signal includes a direct current component on which an alternating current component is superimposed. The photoelectrically converted current signal is converted into a voltage by a conversion resistor 404 included in a current-voltage conversion circuit 410. Then, a differentiating circuit 409 including a capacitor 407 and a resistor 408 negates the direct current component in the voltage, and extracts the alternative current only. Thus, the alternating current component is outputted as an output voltage Vout. An optical semiconductor device in FIG. 1 is an alternating current amplifier configured above. It is to be notified that NPN transistors 402 and 403, and resistors 405 and 406 provide the photodiode 401 a bias voltage, and amplify a photoelectric current outputted from the photodiode 401, as well.

In order to increase sensitivity of the above described alternating current amplifier, typically, a resistance value of the conversion resistor 404 is enlarged. A voltage fluctuation range (voltage swing) of the conversion resistor 404 is, however, limited within a variation range of the output voltage Vout of the alternating current amplifier. Thus, one problem occurs when the resistance value of the conversion resistor 404 is enlarged in that the photoelectric current flowing into the photodiode 401; that is a dynamic range of the photoelectric current flowing into conversion resistor 404, becomes small.

For example, the largest photoelectric current Imax to be possibly flown into the conversion resistor 404 becomes significantly small to be expressed as:

$$Imax = (5 - 2 \times 0.7)/200 \text{ k}\Omega = 18 \text{ }\mu\text{A}$$

where the resistance value of the conversion resistor 404 is 200 k$\Omega$, a forward voltage $V_{BE}$ of the NPN transistors 402 and 403 is 0.7 V, and a direct current voltage of a direct current drive power source Vcc is 5V.

Further, when a low cut-off frequency fc in low frequency in the differentiating circuit 409 is conceived to be set low in the case where the alternating current amplifier is to be a monolithic integrated circuit, a capacitance value of the capacitor 407 in the differentiating circuit 409 needs to be enlarged. Thus, the only way to set the low cut-off frequency fc is to increase the size of the capacitor 407. This prevents the alternate current amplifier from downsizing.

For example, a transfer rate is 115.2 kbps in the SIR (Serial IrDA) of the IrDA. Thus, a capacitance value C, of the capacitor 407, to be needed in the case where the cut-off frequency fc in the differentiating circuit 409 is set to 100 KHz, is expressed as:

$$fc = 1/(2\pi \times C \times 10 \text{ k}\Omega) = 100 \text{ kHz}$$

where the resistance value of the resistor 408 in the differentiating circuit 409 is 10 k$\Omega$. Accordingly, the capacitance value becomes relatively large to be C=160 pF.

As described above, the alternating current amplifier shown in FIG. 1 has problems in that: a dynamic range of a photoelectric current becomes small; and the alternating current amplifier cannot be downsized when an alternating current amplifier is to be a monolithic integrated circuit.

Thus, a structure shown in Patent Reference 1: Japanese Unexamined Patent Application Publication No. 04-32307 has been proposed. FIG. 2 is a circuit diagram of an alternating current amplifier photoelectrically converting a light signal including an alternating current component and a direct current component, and then extracting only the alternating current component from a current signal obtained through the photoelectric conversion, and amplifies the extracted alternating current component. The alternating current amplifier in the circuit diagram includes two photodiodes 501 and 502, a current mirror circuit 510, and a current-voltage conversion circuit 410. Here, the photodiodes 501 and 502 receive to convert a light signal into a current signal. The current mirror circuit 510 extracts only the alternating current component from the above current signal, using NPN transistors 511 and 512, and a capacitor 515. Here, the NPN transistors 511 and 512 are respectively connected to photodiodes 501 and 502, and the capacitor 515 is connected between a base and a collector of an NPN transistor 512. The current-voltage conversion circuit 410 has an identical structure to the current-voltage conversion circuit 410 in FIG. 1, and converts an output current $I_{14}$ of the current mirror circuit 510 into a voltage.

Photoelectric currents $I_{11}$ and $I_{12}$ are equal since the photodiodes 501 and 502 are both connected to the current mirror circuit 510. Here, the photoelectric currents $I_{11}$ and $I_{12}$ are generated at both of the photodiodes 501 and 502 upon receiving the light signal. Here, the following holds:

$$I_{11} = I_{12} = I_{DC} + I_{AC}$$

where, for each of the photoelectric currents $I_{11}$ and $I_{12}$, the direct current component is $I_{DC}$ and the alternating current component is $I_{AC}$.

The photoelectric current $I_{11}$ directly flows into the NPN transistor 511. With regard to the photoelectric current $I_{12}$, only the direct current component $I_{DC}$ in the photoelectric current $I_{12}$ flows into the NPN transistor 512, since the capacitor 515 connected between the collector and the base of the NPN transistor 512 performs an integral action. Here:

$$I_{13} = I_{DC}$$

is held, where a current flowing into the NPN transistor 512 is $I_{13}$. A current $I_{14}$ flowing into the conversion resistor 404 is held as:

$$I_{14} = I_{12} - I_{13} = (I_{DC} + I_{AC}) - I_{DC} = I_{AC}.$$

In other words, only the alternating current component $I_{AC}$ of the photoelectric current $I_{12}$ equivalent to the photoelectric current $I_{11}$ is flown into the conversion resistor 404. Where a resistance value of the conversion resistor 404 is set to R, an output voltage Vout is expressed as:

$$Vout = R \times I_{AC}$$

Here, only the alternating current component is extracted.

The largest photoelectric currents $I_{11}$ and $I_{12}$ to be possibly flown into the conversion resistor 404 are determined by the largest current value to be possibly flown into the current mirror circuit 510, regardless of the resistance value of the conversion resistor 404. In theory, the current mirror circuit 510 is operationally capable until a rise of a collector potential at the NPN transistor 511 nears a direct current voltage of a direct current drive power source Vcc, the rise occurring by a base current of the NPN transistor 511 flowing into a resistor 513. Considering a practical level, however, in the case where an end-to-end voltage of the resistor 513 is assumed to be raised approximately up to 0.1V, the largest value Imax of the photoelectric currents $I_{11}$ and $I_{12}$ is expressed as follows:

$$Imax=(0.1V/10\ k\Omega)\times 100=1\ mA$$

where the resistance value of the resistor 513 is 10 kΩ, and a current amplification factor of the NPN transistor 511 is 100. Therefore, the Imax (here, 1 mA) is approximately 50 times as great as 18 µA; namely, the largest photoelectric current described in the FIG. 1, and thus, a dynamic range of an input photoelectric current can be kept significantly high even in the case where sensitivity of the photodiode is high.

Now, a capacitance of the capacitor 515 is described when the cut-off frequency fc is set to the 100 kHz described in FIG. 1, in the case where the alternating current amplifier is to be a monolithic integrated circuit. Where the cut-off frequency fc of the current mirror circuit 510 is 100 kHz, as described above, a resistance value of the resistor 514 is 10 kΩ, and the current amplification factor of the NPN transistor 512 is 100, the following expression:

$$fc=1/(2\pi\times C\times 10\ k\Omega)=100\ kHz$$

leads out C=1.6 µF, which is 1/100 of 160 pF described in FIG. 1. Thus, the capacitor 515 can be significantly downsized.

However, the optical semiconductor device in the above related art has following problems.

In the IrDA, the transfer rate is accelerating due to an increasing amount of data to be transferred. The FIR (Fast Infrared) requires the transfer rate of 4 Mbps, and the VFIR (Very Fast Infrared), which is faster than the FIR, requires the transfer rate of 16 Mbps. Further, the UFIR (Ultra Fast Infrared), which is currently under study, requires the transfer rate of 100 Mbps. This requires an optical semiconductor device to operate fast. The optical semiconductor device in the above related art, meanwhile, uses a current mirror circuit. Thus, a response speed of the current mirror circuit is slow in transition from a no-signal state to an operation start with a signal inputted. In other words, the conventional optical semiconductor device has a problem of not operating in a high frequency band (100 MHz, for example).

Moreover, along with the accelerating operation speed, noise generated by the optical semiconductor device increases. To be more specific, a high speed operation of the current mirror circuit from no signal conditions requires the NPN transistor, structuring the current mirror circuit, to be under an active state with a direct current always flown. Hence, noise which current mirror circuit itself generates cannot be ignored. In order to improve an S/N ratio, therefore, unfortunately, low exogenous noise ranging between the direct current and several tens of megahertz needs to be cut down, the several tens of megahertz being close to a signal band.

In order to be compatible with the transfer rate of 100 Mbps as described above: the noise ranging between the direct current and several tens of megahertz needs to be cut down, the several tens of megahertz being close to a signal band; and a high frequency component, which equals to or more than several tens of megahertz, needs to be amplified, as well.

SUMMARY OF THE INVENTION

Hence, the objective of the present invention is to provide an optical semiconductor device which can operate in a high frequency band and negate low exogenous noise ranging between a direct current and several tens of megahertz close to a signal band.

In order to solve the above problems, the optical semiconductor device in the present invention converts a light signal into an electric signal and amplifies the converted electric signal, and includes: a first photodetector which converts a light signal into a current signal; a second photodetector which converts a light signal into a current signal; a current amplifying circuit which includes a first operational amplifier that amplifies an output current from the first photodetector; and a current-voltage conversion circuit which converts an output current from the second photodetector into a voltage, wherein an output terminal of the current amplifying circuit is connected to an input terminal of the current-voltage conversion circuit.

This allows the optical semiconductor device to operate in a high frequency band, and to negate low exogenous noise ranging between a direct current and several tens of megahertz close to a signal band.

Further, the current amplifying circuit may have a low-pass characteristic determined to be a first frequency as a cut-off frequency, the current-voltage conversion circuit may have a low-pass characteristic determined to be a second frequency as a cut-off frequency, the second frequency being greater than the first frequency, and an output current from the current amplifying circuit may be inputted into the second photodetector so as to negate a current component equal to or lower than the first frequency, so that another current component higher than the first frequency is inputted into the current-voltage conversion circuit, the current component and the other current component being included in the output current from the second photodetector.

This allows: the current amplifying circuit to cancel a frequency component equal to or lower than the cut-off frequency in the current amplifying circuit; and the current-voltage conversion circuit to amplify a frequency component higher than the cut-off frequency in the current amplifying circuit. In other words, setting the cut-off frequencies in the respective current amplifying circuit and the current-voltage conversion circuit allows a voltage including a desired frequency component to be obtained.

Moreover, the first photodetector and the second photodetector may be adjacently disposed. In addition, the first photodetector may be disposed around the second photodetector.

This allows: the first and the second photodetectors to receive approximately the same amount of the light signal incidence; and the first and the second photodetectors to cancel the same amount of noise. As a result, cancellation of the low exogenous noise can be facilitated.

Further, the second photodetector may be either a polygon or a circle in shape.

This can provide the second photodetector a large effective light receiving area to an optical lens included in an infrared data communication apparatus when the infrared data communication apparatus is equipped with the optical semiconductor device of the present invention. In the case where the second optical detector is formed in a circle, in particular, the largest light receiving area can be provided to the second photodetector. Further, junction capacitance (parasitic capacitance) of the second photodetector becomes the smallest since the perimeter of the second photodetector becomes the shortest. In other words, junction capacitance for the input to the current-voltage conversion circuit becomes small, and a load on a high-speed response of the current-voltage conversion circuit is negated, which enables the optical semiconductor device to respond at a high-speed.

In addition, an effective light receiving area of the first photodetector may be smaller than an effective light receiving area of the second photodetector.

This causes an entire area of photodetectors including the areas of the first and second photodetectors to be small, which can downsize the optical semiconductor device.

Moreover, the current amplifying circuit may further include first and second resistors, and an output terminal of the first photodetector and an end of the first resistor may be connected to a negative input terminal of the first operational amplifier, another end of the first resistor and an end of the second resistor may be connected to an output terminal of the first operational amplifier, and another end of the second resistor and an output terminal of the second photodetector may be connected to a positive input terminal of the first operational amplifier.

This allows a current amplification factor to be adjusted by adjusting the resistance values of the first and second resistors. In other words, the adjustment of the current amplification factor, based on a value of a photoelectric current which each of the first and second photodetectors outputs, can cancel the low exogenous noise.

Further, the current-voltage conversion circuit may include a second operational amplifier and a third resistor, and the output terminal of the second photodetector, the output terminal of the current amplifying circuit, and an end of the third resistor may be connected to a negative input terminal of the second operational amplifier, and the other end of the third resistor may be connected to the output terminal of the second operational amplifier.

This allows a signal with the low exogenous noise canceled to be converted into a voltage, the signal being a photoelectric current only having a desired high-frequency component.

In addition, the current amplifying circuit may further include a capacitor which is connected to the negative input terminal of the first operational amplifier, and a capacitance value of the capacitor may be greater than a junction capacitance value of the second photodetector.

This allows a capacitance value of the capacitor to be changed, which facilitates to control a frequency band of the low exogenous noise intended to be canceled.

Moreover, a resistance value of the first resistor may be greater than a resistance value of the second resistor.

This allows the current amplification factor of the current amplification circuit to be set to one or greater even though the effective light receiving area of the first photodetector is smaller than the effective light receiving area of the second photodetector, and thus a smaller effective light receiving area can be provided to the first photodetector. In other words, the entire area including the areas of the photodetectors can further be reduced.

Further, a ratio of an effective light receiving area of the first photodetector to an effective light receiving area of the second photodetector may be equal to a ratio of a resistance value of the second resistor to a resistance value of the first resistor.

Even though the effective light receiving area of the first photodetector is different from the effective light receiving area of the second photodetector, this allows the low exogenous noise to be canceled as much as the case where the effective light receiving areas of the respective first and second photodetectors are equivalent by adjusting the current amplification factor of the current amplification circuit.

In addition, the present invention can be implemented as an infrared data communication apparatus including the optical semiconductor device in the present invention, as well as implemented as the above mentioned optical semiconductor device.

The present invention can provide an optical semiconductor device which: is included in an infrared data communication apparatus that requires a transfer rate of 100 Mbps, such as the UFIR; enables a high-speed operation; and can cut low exogenous noise ranging between a direct current and several tens of megahertz close to a signal band.

FURTHER INFORMATION ABOUT TECHNICAL BACKGROUND TO THIS APPLICATION

The disclosure of Japanese Patent Application No. 2007-263580 filed on Oct. 9, 2007 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 7A is a diagram exemplifying a shape of a photodiode in the present invention;

FIG. 7B is a diagram exemplifying a shape of the photodiode in the present invention;

FIG. 7C is a diagram exemplifying a shape of the photodiode in the present invention.

DESCRIPTION OF THE PREFERRED EMBODIMENTS

Figure 1:
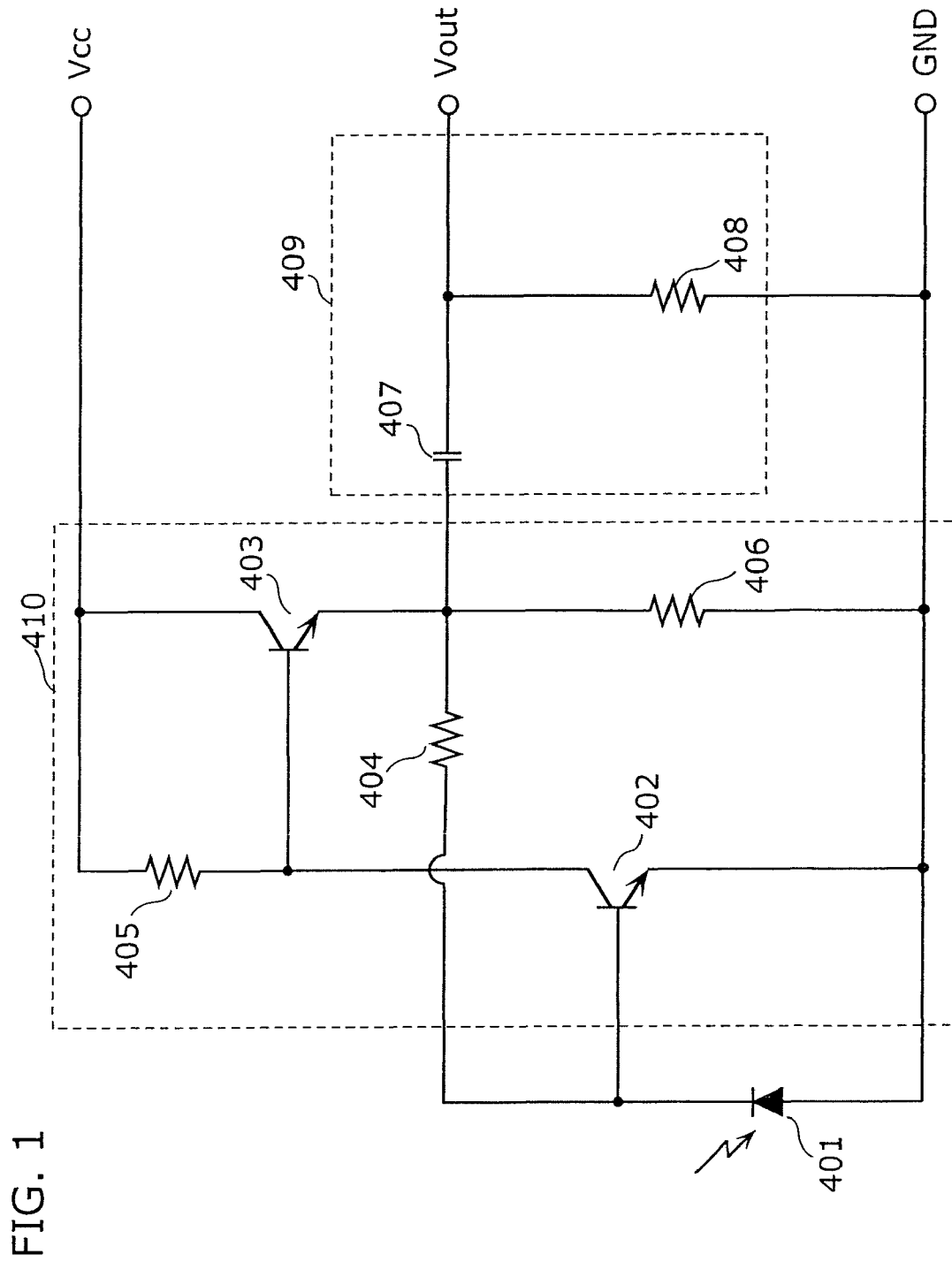
FIG. 1 is a circuit diagram showing an example of an optical semiconductor device in the prior art.
Figure 2:
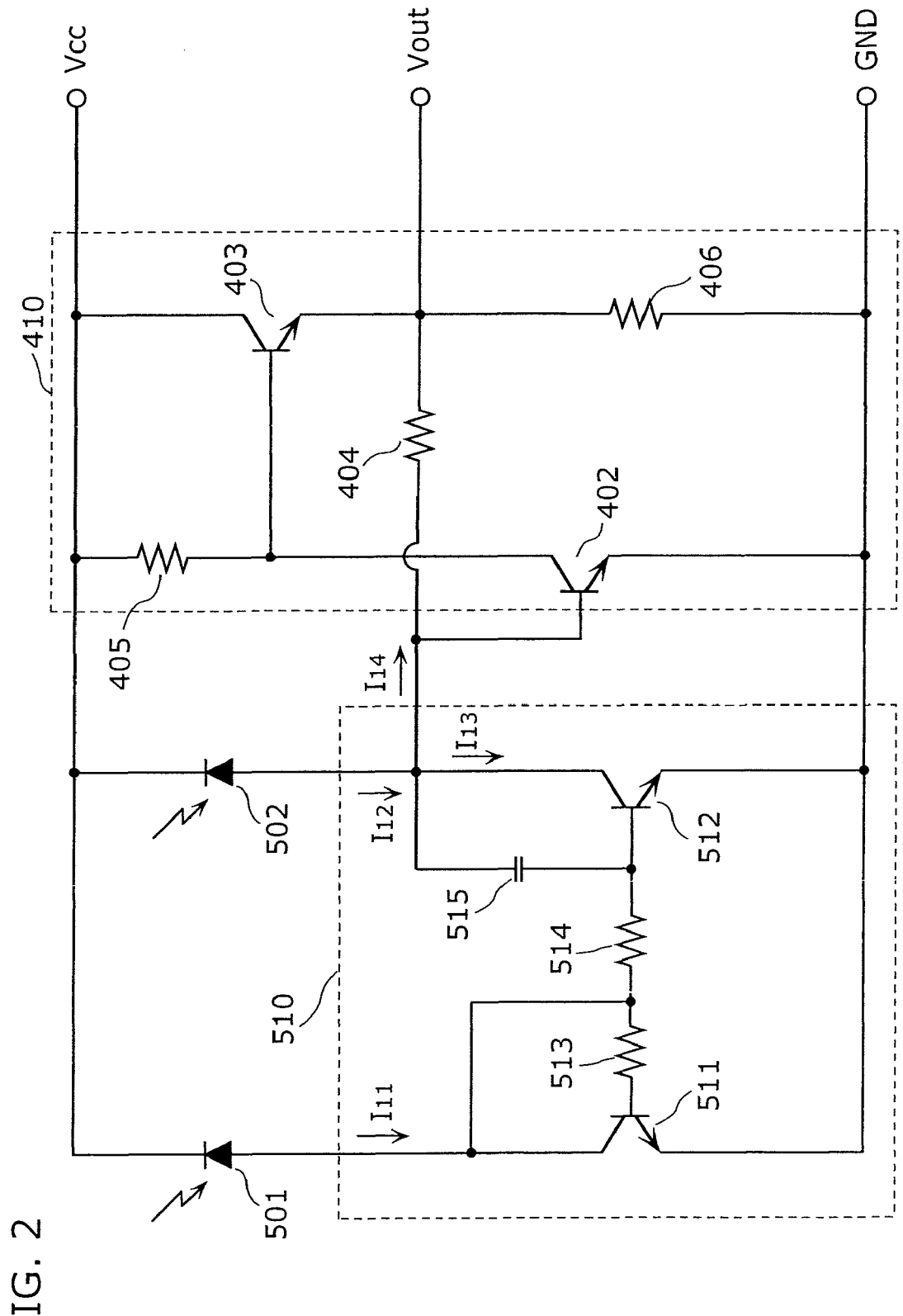
FIG. 2 is a circuit diagram showing an example of an optical semiconductor device in the prior art.

Embodiments of the present invention shall be described in detail, referring to the drawings, hereinafter.

First Embodiment

Having a current amplifying circuit including an operational amplifier, an optical semiconductor device of the embodiment amplifies a current obtained by a first photodiode receiving a light signal to photoelectrically convert. In the case where a cut off frequency of the current amplifying circuit is several tens of megahertz, an input of the amplified current into a second photodiode negates a component up to several tens of megahertz out of a direct current of a photoelectric current outputted from the second photodiode. Then, having a current-voltage conversion circuit including an operational amplifier, the optical semiconductor device converts only a current into a voltage to output, the current including a high frequency component from which the component to the several tens of megahertz is negated out of the direct current.

Figure 3:
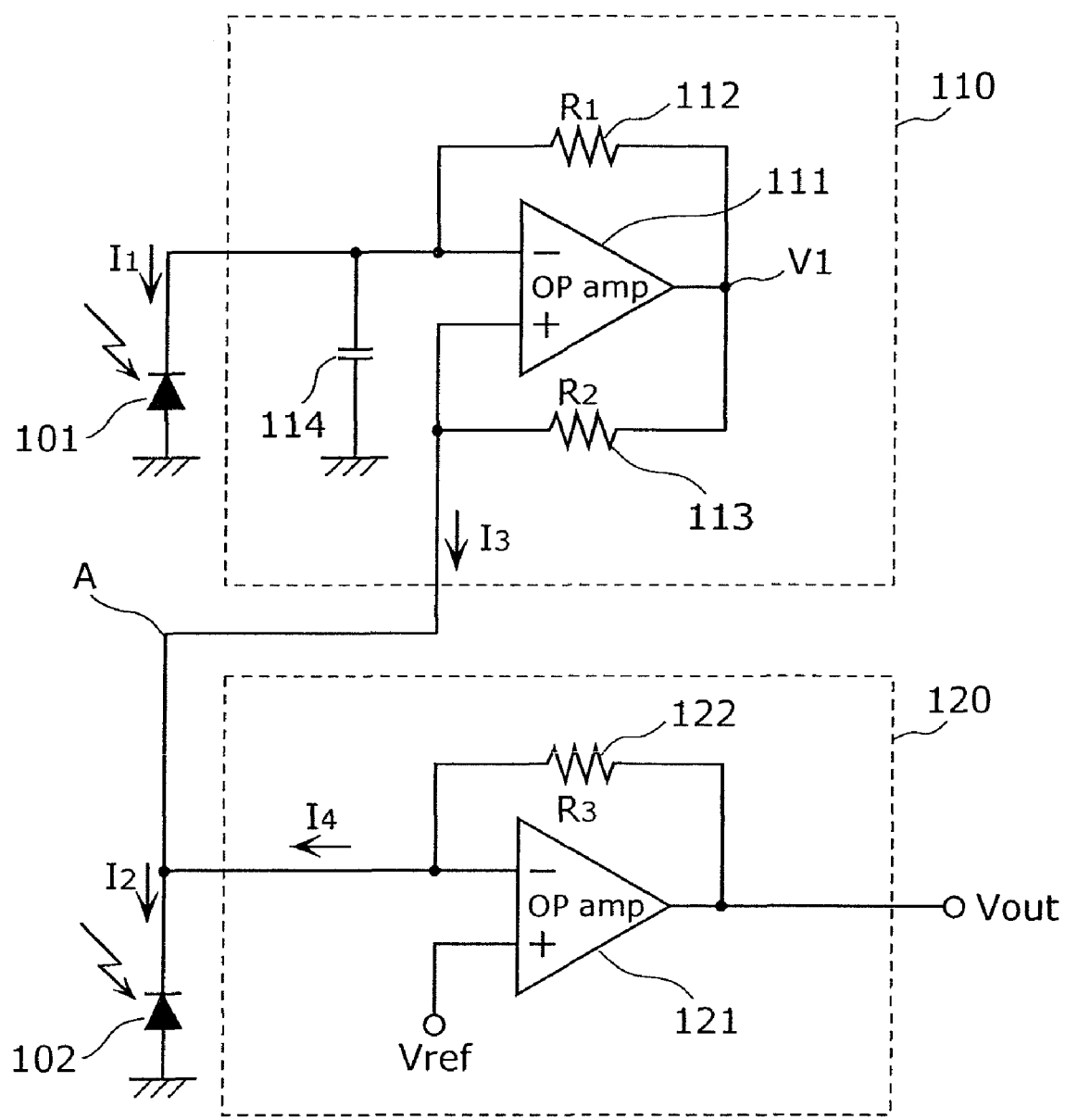
FIG. 3 is a circuit diagram showing an example of an optical semiconductor device in the present invention.

FIG. 3 is a circuit diagram showing an example of the optical semiconductor device in the present embodiment.

The optical semiconductor device in the drawing includes photodiodes 101 and 102, a current amplifying circuit 110, and a current-voltage conversion circuit 120. Here, an output terminal of the current amplifying circuit 110 and an input terminal of the current-voltage conversion circuit 120 are connected, and the connection point is referred to as Point A.

The photodiode 101 outputs a current $I_1$ by receiving a light signal and photoelectrically converting the received light signal. An anode of the photodiode 101 is connected to ground, and a cathode of the photodiode 101 is connected to an input terminal of the current amplifying circuit 110. The photodiode 101 is an example of photodetectors.

The photodiode 102 outputs a current $I_2$ by receiving a light signal and photoelectrically converting the received light signal. An anode of the photodiode 102 is connected to ground, and a cathode of the photodiode 102 is connected to an output terminal of the current amplifying circuit 110 and an input terminal of the current-voltage conversion circuit 120. The photodiode 102 is an example of photodetectors.

The current amplifying circuit 110 outputs a current $I_3$ by amplifying the current $I_1$ outputted from the photodiode 101. The current amplifying circuit 110 includes an operational amplifier 111, conversion resistors 112 and 113, and a capacitor 114.

A negative input terminal of the operational amplifier 111 is connected to the cathode of the photodiode 101, an end of conversion resistor 112, and an end of the capacitor 114. A positive input terminal of the operational amplifier 111 is connected to an end of the conversion resistor 113, the cathode of the photodiode 102, and a negative input terminal of the operational amplifier 121. An output terminal of the operational amplifier 111 is connected to the other ends of the conversion resistors 112 and 113. The input terminal and the output terminal of the current amplifying circuit 110 are equivalent to the negative input terminal and the positive input terminal of the operational amplifier 111, respectively.

The current-voltage conversion circuit 120 converts the current $I_2$ outputted from the photodiode 102 into a voltage. The current-voltage conversion circuit 120 includes the operational amplifier 121 and a conversion resistor 122.

The negative input terminal of the operational amplifier 121 is connected to the cathode of the photodiode 102, an end of the conversion resistor 122, and the output terminal of the current amplifying circuit 110 (the positive input terminal of the operational amplifier 111). A positive input terminal of the operational amplifier 121 is connected to a reference voltage Vref. An output terminal of the operational amplifier 121 is connected to the other end of the conversion resistors 122. The input terminal and an output terminal of the current-voltage conversion circuit 120 are equivalent to the negative input terminal and the output terminal of the operational amplifier 121, respectively.

Figure 4:
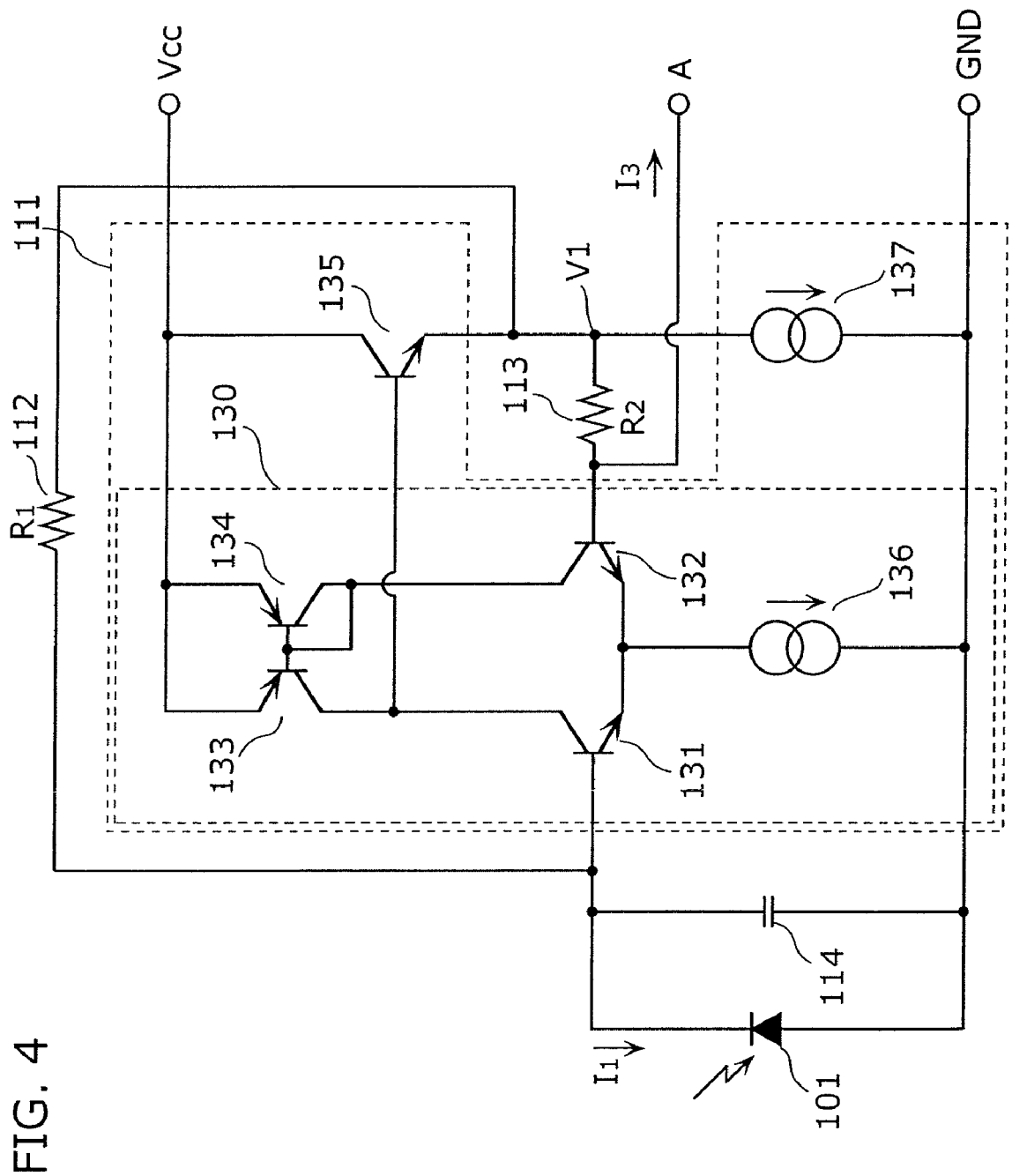
FIG. 4 is a circuit diagram showing in detail an example of a current amplifying circuit in the present invention.

FIG. 4 is a drawing detailing a circuit structure of the current amplifying circuit 110.

As shown in the drawing, the operational amplifier 111 included in the current amplifying circuit 110 includes a differential amplifier 130, an NPN transistor 135, and a constant current source 137. The differential amplifier 130 includes NPN transistors 131 and 132, PNP transistors 133 and 134, and a constant current source 136.

A base of the NPN transistor 131 is equivalent to the negative input terminal of the operational amplifier 111. A base of the NPN transistor 132 is equivalent to the positive input terminal of the operational amplifier 111. Emitters of the NPN transistors 131 and 132 are connected to an end of the constant current source 136. A collector of the NPN transistor 131 is connected to a collector of the PNP transistor 133, and a base of the NPN transistor 135. A collector of the NPN transistor 132 is connected to a collector of the PNP transistor 134, and bases of the PNP transistor 133 and 134. Emitters of the PNP transistors 133 and 134, and a collector of the NPN transistor 135 are connected to a voltage Vcc. An emitter of the NPN transistor 135, connected to an end of the constant current source 137, is equivalent to the output terminal of the operational amplifier 111. The other ends of the constant current sources 136 and 137 are connected to ground.

Next, an operation of the optical semiconductor device in the embodiment when receiving the light signal shall be described, using FIGS. 3 and 4. It is noted that the photodiodes 101 and 102 has equivalent effective light receiving areas in size in the embodiment. Here, when the photodiodes 101 and 102 are irradiated with the same amount of light signal, the currents $I_1$ and $I_2$ flowing the respective photodiodes 101 and 102 become equivalent.

The photodiode 101 is irradiated with a light signal having an alternating current component superimposed on a direct current component, so that the photoelectrically converted photoelectric current $I_1$ flows in the photodiode 101. The photoelectric current $I_1$ is expressed, as a sum of the direct current component $I_{DC}$ and the alternating current component $I_{AC}$, to be the following:

$$I_1 = I_{DC} + I_{AC}.$$

The photoelectric current $I_1$ is converted into a voltage by the conversion resistor 112, and then outputted to an output V1 of the operational amplifier 111. The photoelectric current $I_1$ is further converted from the voltage into a current by the conversion resistor 113, and then outputted to the output terminal of the current amplifying circuit 110 as an output current $I_3$. The output current $I_3$ is expressed as:

$$I_3 = R_1/R_2 \times I_1$$

where a resistance value of the conversion resistor 112 is $R_1$, and a resistance value of the conversion resistor 113 is $R_2$. In other words, the photoelectric current $I_1$ is amplified to $R_1/R_2$ times, and then outputted to Point A as the output current $I_3$. For example, the current amplification factor $(R_1/R_2)$ is 1 where $R_1 = 5$ k$\Omega$, and $R_2 = 5$ k$\Omega$. Hence, only on the basis of the direct current component, the output current $I_3$ is expressed as:

$$I_3 = I_{DC}.$$

In other words, the output current $I_3$ of the current amplifying circuit 110 is amplified based on a current amplification factor defined by the direct current component $I_{DC}$ of the photoelectric current $I_1$ outputted from the photodiode 101, and the conversion resistors 112 and 113.

Here, the direct current component $I_{DC}$ represents a current having a frequency component equal to or less than a cut off frequency fcl calculated by the following description.

Figure 5:
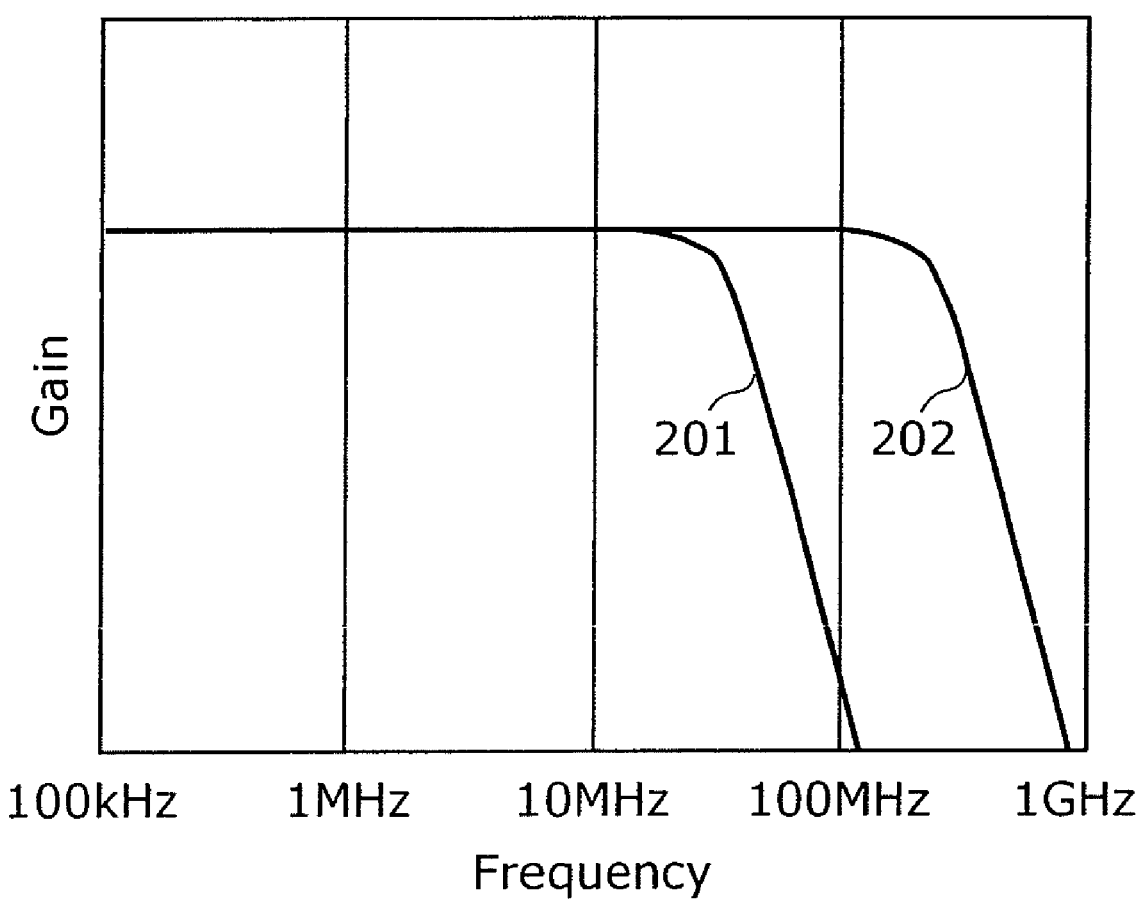
FIG. 5 is a diagram showing frequency characteristics of the optical semiconductor device in the present invention.

A response speed of the current amplifying circuit 110 is determined by: the sum of junction capacitance of the photodiode 101 and capacitance of the capacitor 114; and the resistance value of the conversion resistor 112, in the case where a response speed of the operational amplifier 111 is fast enough. For example, a cut off frequency fcI of the current amplifying circuit 110 is expressed as follows:

$$fcI = 1/(2\pi \times (CP1 + C1) \times R1)$$
$$= 1/(2\pi \times (0.1\,\text{pF} + 1\,\text{pF}) \times 5k\Omega)$$
$$= 29\,\text{MHz}$$

where a junction capacitance value $CP_1$ of the photodiode 101 is 0.1 pF, a capacitance value $C_1$ of the capacitor 114 is 1 pF, and the resistance value $R_1$ of the conversion resistor 112 is 5 kΩ. FIG. 5 describes a frequency characteristic. A frequency characteristic curve 201 in the drawing shows a frequency characteristic of the current amplifying circuit 110.

In the case where the photodiode 102 receives the same amount of the light signal as photodiode 101 receives, the photoelectric current $I_2$ flowing into the photodiode 102 equals to the photoelectric current $I_1$ since the photodiodes 101 and 102 have equivalent effective light areas in size in the embodiment. Hence, the photoelectric current $I_2$ is expressed as follows:

$$I_2 = I_{DC} + I_{AC}$$

In addition, the photoelectric current $I_2$ is the sum of the output current $I_3$ of the current amplifying circuit 110 and an input current $I_4$ of the current-voltage conversion circuit 120. Accordingly, the input current $I_4$ of the current-voltage conversion circuit 120 is expressed as:

$$I_4 = I_2 - I_3$$
$$= (I_{AC} + I_{DC}) - I_{DC}$$
$$= I_{AC}.$$

In other words, only the alternating current component, out of the photoelectric current $I_2$ outputted from the photodiode 102, is inputted into the current-voltage conversion circuit 120. This allows the current-voltage conversion circuit 120 to amplify only the alternating current component of the photoelectric current $I_2$ outputted from the photodiode 102.

Here is a description of a cut off frequency fcV of the current-voltage conversion circuit 120. The cut off frequency fcV of the current-voltage conversion circuit 120 is expressed as:

$$fcV = 1/(2\pi \times CP_2 \times R_3)$$
$$= 1/(2\pi \times 0.1\,\text{pF} \times 10k\Omega)$$
$$= 159\,\text{MHz}$$

where a junction capacitance value $CP_2$ of the photodiode 102 is 0.1 pF, and the resistance value $R_3$ of the conversion resistor 122 is 10 kΩ. A frequency characteristic curve 202 in FIG. 5 shows a frequency characteristic of the current-voltage conversion circuit 120. The optical semiconductor device in the embodiment amplifies a photoelectric current to convert to a voltage. Here, the photoelectric current has a frequency component larger than the cut off frequency fcI and smaller than fcV.

As described above, the optical semiconductor device of the present embodiment can amplify a high frequency component to convert to a voltage, while eliminating a low exogenous noise component ranging between a direct current and several tens of megahertz. Thus, an optical semiconductor device, which enables accurate communication, uninfluenced by a low exogenous noise component ranging between a direct current and several tens of megahertz at a transfer rate of 100 Mbps, utilized in the UFIR, can be implemented.

Figure 6A:
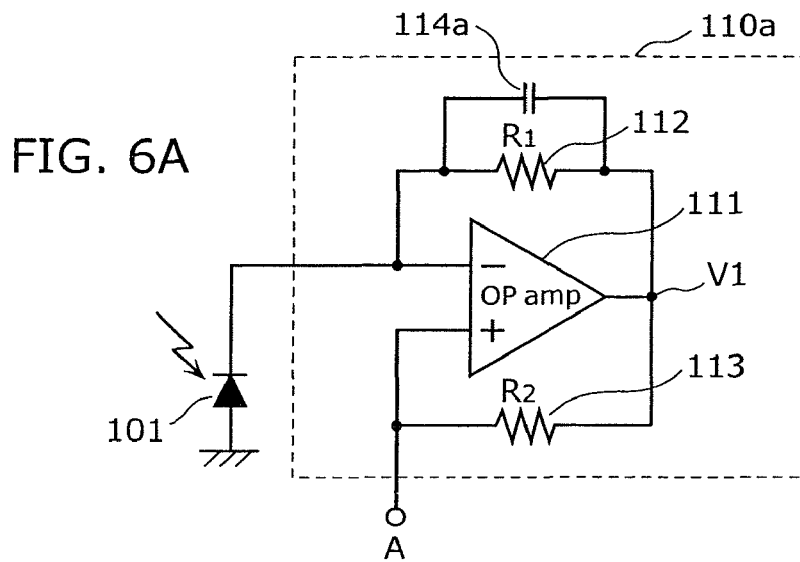
FIG. 6A is a circuit diagram showing an example of the current amplifying circuit in the present invention.
Figure 6B:
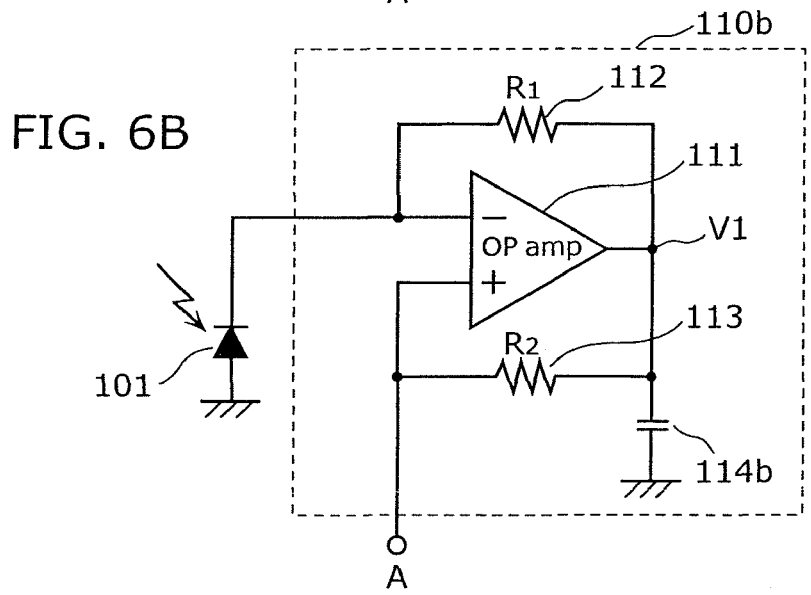
FIG. 6B is a circuit diagram showing an example of the current amplifying circuit in the present invention.
Figure 6C:
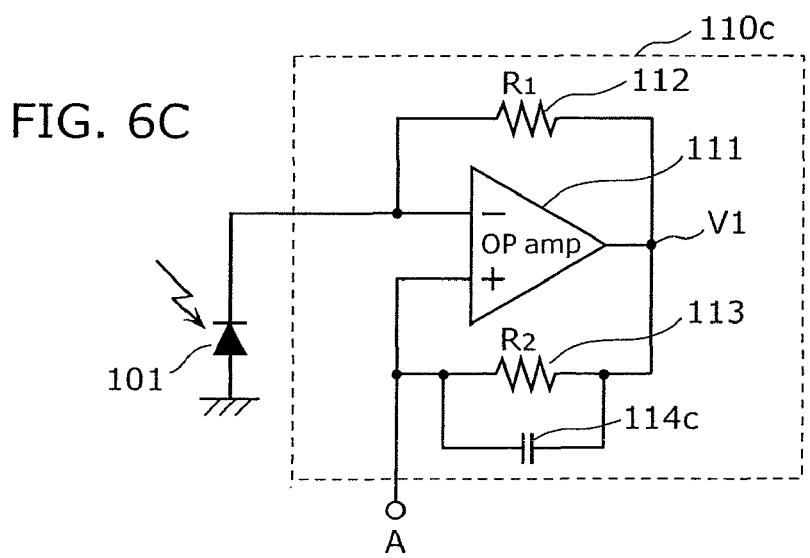
FIG. 6C is a circuit diagram showing an example of the current amplifying circuit in the present invention.

It is noted that, in the embodiment, the capacitor 114 is connected to the negative input terminal of the operational amplifier 111 in order to adjust the response speed of the current amplifying circuit 110. Instead, a capacitor 114a and the conversion resistor 112 may be connected in parallel as shown in FIG. 6A. Further, a capacitor 114b may be connected between the output terminal V1 of the operational amplifier 111 and a predetermined electric potential as shown in FIG. 6B (ground in the drawing). Moreover, the capacitor 114c and the conversion resistor 113 may be connected in parallel, as shown in FIG. 6C. In addition, at least two of each capacitors 114, 114a, 114b, and 114c may be connected. It is noted, however, that a capacitance value, of the capacitors, which the circuit needs can be easily calculated by the sum of a capacitance value of the capacitor 114 and the junction capacitance value CP1 of the photodiode 101 by connecting the capacitor 114 to the negative input terminal of the operational amplifier 111 described in the embodiment. This allows the easiest designing of the optical semiconductor device even though the junction capacitance value $CP_1$ of the photodiode 101 changes.

Further, in the embodiment, 29 MHz and 159 MHz are exemplified as the cut off frequencies of the current amplifying circuit 110 and the current-voltage conversion circuit 120, respectively; however, any frequency is available as far as the cut off frequency of the current-voltage conversion circuit 120 is larger than that of the current amplifying circuit 110. Since a transfer rate of 100 Mbps is required in the UFIR, for example, the cut off frequencies of the current amplifying circuit 110 and the current-voltage conversion circuit 120 may be set to 10 MHz to 80 MHz and 120 MHz or above, respectively.

Second Embodiment

An optical semiconductor device in a second embodiment converts a received light signal into an electric signal to amplify the converted electric signal in the case where two photodiodes have different effective light receiving areas in size.

FIGS. 7A to 7C exemplifies patterns of shapes of photodiodes in the embodiment.

The circuit structure of the optical semiconductor in the embodiment is the same as that of the optical semiconductor in the first embodiment. However, the circuit structure of the optical semiconductor in the second embodiment shall be described because a circuit constant needs to be changed based on a shape and layout of a photodiode converting a light signal to a current signal.

Photodiodes 101a and 102a in FIG. 7A corresponds to the photodiodes 101 and 102 in FIG. 3, respectively. The photodiode 101a is adjacently disposed around the photodiode 102a. Here, effective light receiving areas of the photodiodes 101a and 102a are referred to as $S_{1a}$ and $S_{2a}$, respectively. Values of the conversion resistors 112 and 113 in FIG. 3 are set to satisfy $R_1:R_2=S_{2a}:S_{1a}$. Thus, only an alternate component out of a current signal can be amplified. Here, the current signal is converted from the light signal with which the photodiode is irradiated. Hereinafter, $S_{1a}:S_{2a}=1:2$ are assumed to be satisfied for convenience. Further, a case where the photodiodes 101a and 102a are evenly irradiated with the light signal is described.

It is assumed that a direct current component and an alternating current component of the photoelectric current $I_1$ outputted from the photodiode 101a are $I_{DC}$ and $I_{AC}$, respectively. Hence, the photoelectric current $I_1$ is expressed as:

$$I_1 = I_{DC} + I_{AC}.$$

The photoelectric currents $I_1$ and $I_2$ are proportional to the effective light receiving areas to be expressed as:

$$I_2 = 2 \times I_1.$$

The output current $I_3$ of the current amplifying circuit 110 is expressed as:

$$I_3 = R_1/R_2 \times I_1.$$

For example, the current amplification factor of the output current is 2 where $R_1$ is 5 kΩ, and $R_2$ is 2.5 kΩ, and $$I_3 = 2 \times I_{DC}$$

is expressed when only the direct current component in the photoelectric current is considered. In other words, the output current $I_3$ of the current amplifying circuit 110 is a current that the direct current component $I_{DC}$ of the photoelectric current $I_1$ is amplified in accordance with a current amplification factor defined by the conversion resistors 112 and 113.

Here, the direct current component $I_{DC}$ represents a current having a frequency component equal to or less than a cut off frequency fcI calculated based on the following description. An effective light receiving area of the photodiode 101a is a half as large as that of the photodiode 102a, and junction capacitance of the photodiode 101a is substantially in proportion to the effective light receiving area, to be a half as great as junction capacitance of the photodiode 102a. Hence, the cut off frequency fcI of the current amplifying circuit 110 is expressed as:

$$fcI = 1/(2\pi \times (CP_{1a} + C_1) \times R_1)$$
$$= 1/(2\pi \times (0.05\,\text{pF} + 1.05\,\text{pF}) \times 5k\Omega)$$
$$= 29\,\text{MHz}$$

where a junction capacitance value $CP_{1a}$ of the photodiode 101a is 0.05 pF, a capacitance value $C_1$ of the capacitor 114 is 1.05 pF, and a resistance value $R_1$ of the conversion resistor 112 is 5 kΩ. With the capacitance value $C_1$ of the capacitor 114 adjusted, a frequency characteristic of the current amplifying circuit 110 shown with the frequency characteristic curve 201 in FIG. 5.

Next, the current $I_4$ inputted into the current-voltage conversion circuit 120 is expressed as:

$$I_4 = I_2 - I_3$$
$$= 2 \times I_1 - I_3$$
$$= 2 \times (I_{DC} + I_{AC}) - 2 \times I_{DC}$$
$$= 2 \times I_{AC}.$$

In other words, only the alternating current component, out of the photoelectric current $I_2$ outputted from the photodiode 102a, is inputted into the current-voltage conversion circuit 120. This allows the current-voltage conversion circuit 120 to amplify only the alternating current component of the photoelectric current $I_2$ outputted from the photodiode 102a.

Here is a description of the cut off frequency fcV of the current-voltage conversion circuit 120. The cut off frequency fcV of the current-voltage conversion circuit 120 is expressed as:

$$fcV = 1/(2\pi \times CP_{2a} \times R_3)$$
$$= 1/(2\pi \times 0.1\,\text{pF} \times 10k\Omega)$$
$$= 159\,\text{MHz}$$

where a junction capacitance value $CP_{2a}$ of the photodiode 102a is 0.1 pF, and a resistance value $R_3$ of the conversion resistor 122 is 10 kΩ. Thus, frequency characteristic of the current-voltage converting circuit 120 is shown with the frequency characteristic curve 202 in FIG. 5. The optical semiconductor device in the embodiment can amplify a photoelectric current having a frequency component larger than the cut off frequency fcI and smaller than the cut-off frequency fcV, and then can convert the amplified photoelectric current to a voltage. In other words, the optical semiconductor device of the embodiment can amplify a high frequency component to convert to a voltage, while eliminating a low exogenous noise component ranging between a direct current and several tens of megahertz. Thus, an optical semiconductor device, which enables accurate communication, uninfluenced by a low exogenous noise component ranging between a direct current and several tens of megahertz at a transfer rate of 100 Mbps, utilized in the UFIR, can be implemented.

As described above, the optical semiconductor device in the embodiment can cancel a low exogenous noise component with high accuracy, by adjusting the current amplification factor of the current amplifying circuit 110, even in the case where the two photodiodes 101a and 102a have different effective light receiving areas. Specifically, the photoelectric current $I_2$ of the photodiode 102a and the value of the direct current component of the output current $I_3$ of the current amplifying circuit 110 become substantially equivalent by setting the resistance value $R_1$ of the conversion resistor 112 in the current amplifying circuit 110 and the resistance value $R_2$ of the conversion resistor 113 to satisfy $S_{1a}:S_{2a}=R_2:R_1$.

Further, in the embodiment, even though the effective light receiving area of the photodiode 101a is a half as large as that of the photodiode 102a, the same amount of the output voltage Vout, as described in the first embodiment, can be obtained. In other words, according to the embodiment, the sum of the effective light receiving areas of the photodiodes 101a and 102a is reduced to three fourth of the sum of the effective light receiving areas of the photodiodes 101 and 102 in the first embodiment. This allows the optical semiconductor device to be downsized.

It is noted that response characteristics of a current-voltage conversion circuit can be further improved by forming the photodiodes 102b and 102c in a polygon or circle as shown in FIGS. 7B and 7C, since the junction capacitance of the photodiodes 102b and 102c can be reduced. It is because junction capacitance of a photodiode is obtained out of areas of a base and a lateral area. The greater the areas of the base and the lateral area of the photodiode become, the greater the junction capacitance becomes. The lateral area is found by multiplying together the perimeter of the photodiode and the junction of the photodiode. Thus, a polygon has a smaller lateral area than that of the quadrilateral in the case where the polygon and the quadrilateral has the same base areas since the polygon has a longer perimeter than that of a quadrilateral. Moreover, a circular form has a smaller lateral area, since having a shorter perimeter. Thus, the circular form enables a junction characteristic to be a minimum, and the response characteristic of the current-voltage conversion circuit to be improved.

Third Embodiment

An Infrared data communication apparatus of a third embodiment includes the optical semiconductor device of the present invention; that is, an optical semiconductor device, which enables accurate communication, uninfluenced by a low exogenous noise component ranging between a direct current and several tens of megahertz at a transfer rate of 100 Mbps, utilized in the UFIR, can be implemented.

Figure 8:
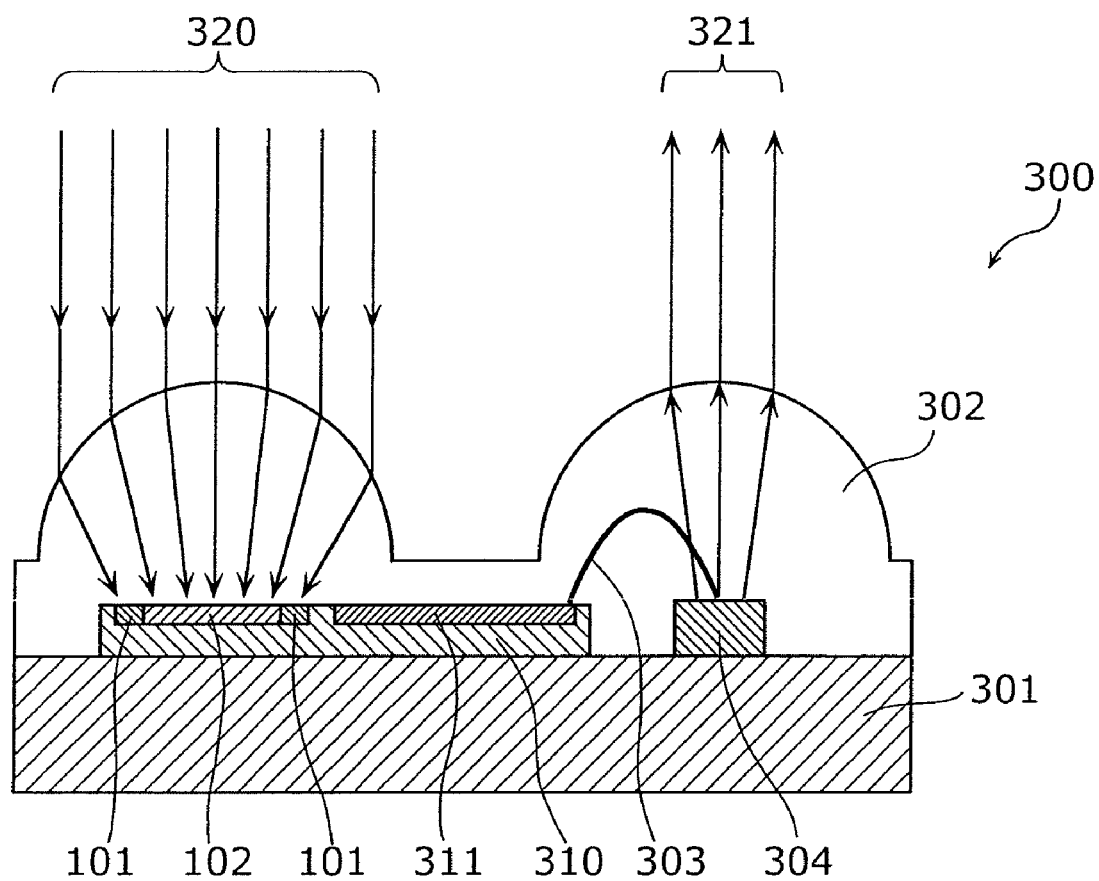
FIG. 8 is a sectional view showing an example of an Infrared data communication apparatus in the present invention.

FIG. 8 is a block diagram of the infrared data communication apparatus in the embodiment.

An infrared data communication apparatus 300 in the drawing includes a substrate 301, lens-forming resin 302, gold wire 303, an LED (Light Emitting Diode) chip 304, and an optical semiconductor device 310.

The gold wire 303 electrically and directly connects the LED chip 304 and the optical semiconductor device 310. The LED chip 304 produce luminescence by a current sent from the optical semiconductor device 310 via the gold wire 303. The optical semiconductor device 310 is structured with the two photodiodes 101 and 102 described in the first or second embodiments, and a signal processing circuit 311 including the current amplifying circuit 110, the current-voltage conversion circuit 120, and an LED driving circuit.

Next, operations of the infrared data communication apparatus 300 shall be described. When the infrared data communication apparatus 300 is irradiated with a light signal 320 having a direct current signal on which an alternating current signal is superimposed, the light signal 320 is condensed with the lens-forming resin 302, and then the two photodiodes 101 and 102 are irradiated with the condensed light signal 320. The photoelectric current is then photoelectrically converted and computed by the signal processing circuit 311. Consequently, a true alternating current signal is outputted as a voltage signal. On a luminous side, a signal voltage is externally inputted into the signal processing circuit 311, and converted into a current signal by the LED driving circuit provided in the signal processing circuit 311. The current signal is transmitted to the LED chip 304 via the gold wire 303, illuminating the LED chip 304. A light signal 321 emitted from the LED chip 304 is diffused with the lens-forming resin 302, and arrives at another infrared data communication apparatus to be targeted to enable communication.

The embodiment enables an Infrared data communication apparatus operating in a frequency band of 100 Mbps utilized in the UFIR. The optical semiconductor device and the Infrared data communication apparatus in the present invention have been described above based on the embodiments. Meanwhile, the present invention shall not be limited to the embodiments. Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

It is noted that, in the optical semiconductor device 310, the photodiodes and the signal processing circuit are provided on the same semiconductor substrate in the embodiment; instead, the photodiodes and the signal processing circuit may be provided on a separate semiconductor substrate. The LED driving circuit may also be provided on another semiconductor substrate. Further, a semiconductor laser chip may be used instead of the LED chip in order to implement greater high frequency luminescence.

INDUSTRIAL APPLICABILITY

The optical semiconductor device in the present invention is applicable to an optical semiconductor device, which enables accurate communication, uninfluenced by a low exogenous noise component ranging between a direct current and several tens of megahertz at a transfer rate of 100 Mbps, utilized in the UFIR. More particularly, the optical semiconductor device in the present invention is useful in applying to an infrared data communication apparatus.

What is claimed is:

1. An optical semiconductor device that converts a light signal into an electric signal and amplifies the converted electric signal, said optical semiconductor device comprising:
    a first photodetector which converts a light signal into a current signal;
    a second photodetector which converts a light signal into a current signal;
    a current amplifying circuit which includes a first operational amplifier which amplifies an output current from said first photodetector; and
    a current-voltage conversion circuit,
    wherein an output terminal of said current amplifying circuit is connected to an input terminal of said current-voltage conversion circuit, and
    said current-voltage conversion circuit converts a current into a voltage, the current being an output current of said current amplifying circuit subtracted from an output current of said second photodetector,
    wherein said current amplifying circuit has a low-pass characteristic determined to be a first frequency as a cut-off frequency,
    said current-voltage conversion circuit has a low-pass characteristic determined to be a second frequency as a cut-off frequency, the second frequency being greater than the first frequency, and
    the output current from said current amplifying circuit is inputted into said second photodetector so as to negate a current component equal to or lower than the first frequency, so that another current component higher than the first frequency is inputted into said current-voltage conversion circuit.

2. The optical semiconductor device according to claim 1, wherein said first photodetector and said second photodetector are adjacently disposed.

3. The optical semiconductor device according to claim 1, wherein said first photodetector is disposed around said second photodetector.

4. The optical semiconductor device according to claim 1, wherein said second photodetector is either a polygon or a circle in shape.

5. The optical semiconductor device according to claim 1, wherein an effective light receiving area of said first photodetector is smaller than an effective light receiving area of said second photodetector.

6. The optical semiconductor device according to claim 1, wherein said current amplifying circuit further includes first and second resistors, and an output terminal of said first photodetector and an end of said first resistor are connected to a negative input terminal of said first operational amplifier, another end of said first resistor and an end of said second resistor are connected to an output terminal of said first operational amplifier, and another end of said second resistor and an output terminal of said second photodetector are connected to a positive input terminal of said first operational amplifier.

7. The optical semiconductor device according to claim 1, wherein said current-voltage conversion circuit includes a second operational amplifier and a third resistor, and an output terminal of said second photodetector, the output terminal of said current amplifying circuit, and an end of said third resistor are connected to a negative input terminal of said second operational amplifier, and another end of said third resistor is connected to the output terminal of said second operational amplifier.

8. The optical semiconductor device according to claim 1, wherein said current amplifying circuit further includes a capacitor which is connected to a negative input terminal of said first operational amplifier, and a capacitance value of the capacitor is greater than a junction capacitance value of said second photodetector.

9. The optical semiconductor device according to claim 6, wherein a resistance value of said first resistor is greater than a resistance value of said second resistor.

10. The optical semiconductor device according to claim 6, wherein a ratio of an effective light receiving area of said first photodetector to an effective light receiving area of said second photodetector is equal to a ratio of a resistance value of said second resistor to a resistance value of said first resistor.

11. An infrared data communication apparatus, comprising:

an optical semiconductor device that converts a light signal into an electric signal and amplifies the converted electric signal; and a signal processing circuit which processes the electric signal outputted from said optical semiconductor device, wherein said optical semiconductor device includes:

a first photodetector which converts a light signal into a current signal;

a second photodetector which converts a light signal into a current signal;

a current amplifying circuit which includes a first operational amplifier amplifying an output current of said first photodetector; and a current-voltage conversion circuit;

wherein an output terminal of said current amplifying circuit is connected to an input terminal of said current-voltage conversion circuit and said current-voltage conversion circuit converts a current into a voltage, the current being an output current of said current amplifying circuit subtracted from an output current of said second photodetector, wherein said current amplifying circuit has a low-pass characteristic determined to be a first frequency to be a cut-off frequency, said current-voltage conversion circuit has a low-pass characteristic determined to be a second frequency as a cut-off frequency, the second frequency being greater than the first frequency, and the output current from said current amplifying circuit is inputted into said second photodetector for eliminating a current component equal to or lower than the first frequency, so that another current component equal to or higher than the first frequency is inputted into said current-voltage conversion circuit.

12. The infrared data communication apparatus according to claim 11, wherein said first photodetector and said second photodetector are adjacently disposed.

13. The infrared data communication apparatus according to claim 11, wherein said first photodetector is disposed so as to surround said second photodetector, and said second photodetector is either a polygon or a circle in shape.

14. The infrared data communication apparatus according to claim 11, wherein an effective light receiving area of said first photodetector is smaller than an effective light receiving area of said second photodetector.

15. The infrared data communication apparatus according to claim 11, wherein said current amplifying circuit further includes first and second resistors, and an output terminal of said first photodetector and an end of said first resistor are connected to a negative input terminal of the first operational amplifier, another end of said first resistor and an end of said second resistor are connected to an output terminal of the first operational amplifier, and another end of said second resistor and an output terminal of the second photodetector are connected to a positive input terminal of said first operational amplifier.

16. The infrared data communication apparatus according to claim 11, wherein said current-voltage conversion circuit includes a second operational amplifier and a third resistor, and an output terminal of said second photodetector, the output terminal of said current amplifying circuit, and an end of said third resistor are connected to a negative input terminal of said second operational amplifier, and another end of said third resistor is connected to the output terminal of said second operational amplifier.

17. The infrared data communication apparatus according to claim 11, wherein said current amplifying circuit further includes a capacitor connected to a negative input terminal of said first operational amplifier, and a capacitance value of the capacitor is greater than a junction capacitance value of said second photodetector.

18. The infrared data communication apparatus according to claim 15, wherein a resistance value of said first resistor is greater than a resistance value of said second resistor, and a ratio of an effective light receiving area of said first photodetector to an effective light receiving area of said second photodetector is equal to a ratio of a resistance value of said second resistor to a resistance value of said first resistor.

* * * * *